US011430631B2

(12) United States Patent
Liu et al.

(10) Patent No.: US 11,430,631 B2
(45) Date of Patent: Aug. 30, 2022

(54) METHODS OF INSPECTING SAMPLES WITH MULTIPLE BEAMS OF CHARGED PARTICLES

(71) Applicant: ASML Netherlands B.V., Veldhoven (NL)

(72) Inventors: Kuo-Shih Liu, Fremont, CA (US); Xuedong Liu, San Jose, CA (US); Wei Fang, Milpitas, CA (US); Jack Jau, Los Altos Hills, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/833,463

(22) Filed: Mar. 27, 2020

(65) Prior Publication Data

US 2020/0227233 A1 Jul. 16, 2020

Related U.S. Application Data

(63) Continuation of application No. PCT/EP2018/075930, filed on Sep. 25, 2018.

(60) Provisional application No. 62/566,177, filed on Sep. 29, 2017.

(51) Int. Cl.
*H01J 37/28* (2006.01)
*H01J 37/26* (2006.01)

(52) U.S. Cl.
CPC ............ *H01J 37/28* (2013.01); *H01J 37/265* (2013.01); *H01J 2237/24495* (2013.01)

(58) Field of Classification Search
CPC .. H01J 37/00; H01J 37/02; H01J 37/26; H01J 37/261; H01J 37/265; H01J 37/28; H01J 2237/24495; H01J 2237/2817

USPC ............................................ 250/306, 307, 311
See application file for complete search history.

(56) References Cited

U.S. PATENT DOCUMENTS

| 6,556,655 | B1* | 4/2003 | Chichereau ............ A61B 6/502 378/108 |
| 6,566,655 | B1* | 5/2003 | Choo ................. G01N 23/2251 250/306 |
| 6,943,349 | B2 | 9/2005 | Adamec et al. |
| 7,244,949 | B2 | 7/2007 | Knippelmeyer et al. |
| 8,294,095 | B2 | 10/2012 | Chen et al. |

(Continued)

FOREIGN PATENT DOCUMENTS

JP 2011 187191 A 9/2011
WO WO 2017/132435 A1 8/2017

OTHER PUBLICATIONS

International Search Report and Written Opinion issued in related PCT International Application No. PCT/EP2018/075930, dated Mar. 19, 2019 (16 pgs.).

*Primary Examiner* — Jason L McCormack
(74) *Attorney, Agent, or Firm* — Finnegan, Henderson, Farabow, Garrett & Dunner, LLP (57) ABSTRACT

Disclosed herein is a method comprising: generating a plurality of probe spots on a sample by a plurality of beams of charged particles; while scanning the plurality of probe spots across a region on the sample, recording from the plurality of probe spots a plurality of sets of signals respectively representing interactions of the plurality of beams of charged particles and the sample; generating a plurality of images of the region respectively from the plurality of sets of signals; and generating a composite image of the region from the plurality of images.

15 Claims, 11 Drawing Sheets

(56) References Cited

U.S. PATENT DOCUMENTS

| | | |
|---|---|---|
| 9,607,805 B2 | 3/2017 | Liu et al. |
| 10,276,346 B1* | 4/2019 | Duffy ..................... H01J 37/28 |
| 2002/0088940 A1* | 7/2002 | Watanabe ............. H01J 37/224 |
| | | 250/310 |
| 2002/0109090 A1* | 8/2002 | Nakasuji ............... H01J 37/063 |
| | | 250/311 |
| 2002/0142496 A1* | 10/2002 | Nakasuji ............ G01N 23/2251 |
| | | 250/492.3 |
| 2006/0289804 A1 | 12/2006 | Knippelmeyer et al. |
| 2016/0268096 A1 | 9/2016 | Ren et al. |
| 2016/0284505 A1 | 9/2016 | Ren et al. |
| 2016/0293379 A1* | 10/2016 | Kim ........................ H01J 37/28 |
| 2016/0322195 A1* | 11/2016 | Sender .................. H01J 37/265 |
| 2017/0025241 A1 | 1/2017 | Li et al. |
| 2017/0025243 A1 | 1/2017 | Ren et al. |
| 2017/0084423 A1 | 3/2017 | Masnaghetti et al. |
| 2017/0084424 A1* | 3/2017 | Masnaghetti ........... H01J 37/28 |
| 2017/0154756 A1 | 6/2017 | Ren et al. |
| 2019/0333732 A1 | 10/2019 | Ren et al. |

* cited by examiner

METHODS OF INSPECTING SAMPLES WITH MULTIPLE BEAMS OF CHARGED PARTICLES

CROSS-REFERENCE TO RELATED APPLICATIONS

This application claims priority to International Application No. PCT/EP2018/075930, filed Sep. 25, 2018, and published as WO 2019/063532 A1, which claims priority of U.S. application 62/566,177 which was filed on Sep. 29, 2017. The contents of these applications are incorporated herein by reference in their entireties.

TECHNICAL FIELD

This disclosure relates to methods for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is a method comprising: generating a plurality of probe spots on a sample by a plurality of beams of charged particles; while scanning the plurality of probe spots across a region on the sample, recording from the plurality of probe spots a plurality of sets of signals respectively representing interactions of the plurality of beams of charged particles and the sample; generating a plurality of images of the region respectively from the plurality of sets of signals; and generating a composite image of the region from the plurality of images.

According to an embodiment, the plurality of probe spots have different sizes or different intensities.

According to an embodiment, the plurality of probe spots are spaced apart.

According to an embodiment, the plurality of probe spots have movements relative to one another while being scanned.

According to an embodiment, time periods during which the plurality of probe spots are respectively scanned across the region are different.

According to an embodiment, the time periods are not temporally continuous.

According to an embodiment, the time periods have partial overlaps.

According to an embodiment, the plurality of sets of signals are recorded not during an entirety of the time periods.

According to an embodiment, each of the plurality of images of the region is generated from only one of the plurality of sets of signals.

According to an embodiment, generating the plurality of images of the region comprises digitizing the plurality of sets of signals with respect to magnitudes of the signals or locations of the plurality of probe spots.

According to an embodiment, the plurality of images of the region are compilations of digital values representing magnitudes of the signals.

According to an embodiment, the composite image of the region is a compilation of averages of the digital values.

According to an embodiment, generating the composite image of the region comprises averaging the plurality of images of the region.

According to an embodiment, averaging the plurality of images is by simple average, weighted average or running average.

According to an embodiment, the method further comprises generating an additional spot on the sample from another beam of charged particles.

According to an embodiment, the additional spot has a different size or a different intensity from that of the plurality of the probe spots.

According to an embodiment, the method further comprises charging the region with electric charges, using the additional spot.

According to an embodiment, the method further comprises scanning the additional spot before or while scanning the plurality of probe spots.

According to an embodiment, no signal representing interactions of the other beam and the sample is recorded from the additional spot.

Disclosed herein is a computer program product comprising a non-transitory computer readable medium having instructions recorded thereon, the instructions when executed by a computer implementing any of the above methods.

DETAILED DESCRIPTION

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1:
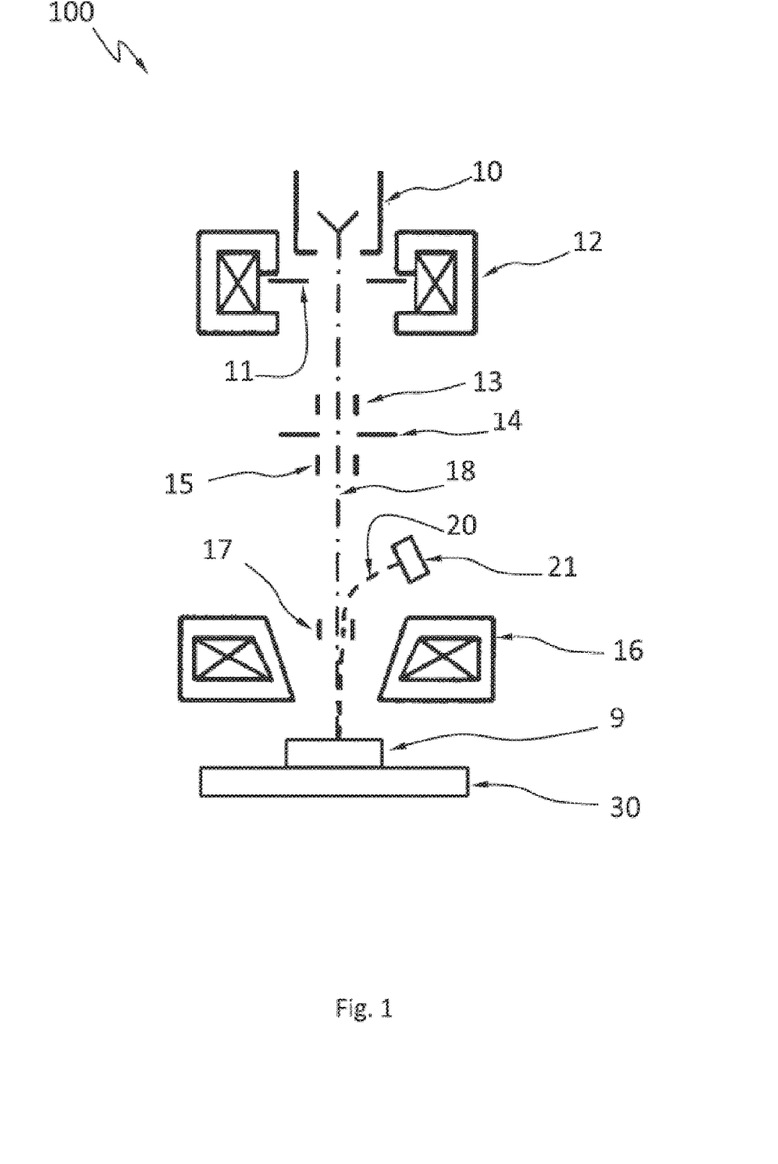
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample, such as an ExB charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the ExB charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used. The throughput of charged particle beam inspection is relatively low due to interactions (e.g., the Coulomb effect) among the charged particles used therein. More than one beam of charged particles may be used to increase the throughput.

In an example, multiple beams of charged particles can simultaneously scan multiple regions on a sample. The scanning of the multiple beams may be synchronized or independent. The multiple regions may have overlaps among them, may be tiled to cover a continuous area, or may be isolated from one another. Signals generated from the interactions of the beams and the sample may be collected by multiple detectors. The number of detectors may be less than, equal to, or greater than the number of the beams. The multiple beams may be individually controlled or collectively controlled.

Multiple beams of charged particles may form multiple probe spots on a surface of a sample. The probe spots can respectively or simultaneously scan multiple regions on the surface. The charged particles of the beams may generate signals from the locations of the probe spots. One example of the signals is secondary electrons. Secondary electrons usually have energies less than 50 eV. Another example of the signals is backscattered electrons when the charged particles of the beams are electrons. Backscattered electrons usually have energies close to landing energies of the electrons of the beams. The signals from the locations of the probe spots may be respectively or simultaneously collected by multiple detectors.

The multiple beams may be from multiple sources respectively, or from a single source. If the beams are from multiple sources, multiple columns may scan and focus the beams onto the surface, and the signals generated by the beams may be detected by detectors in the columns, respectively. An apparatus using beams from multiple sources may be called as a multi-column apparatus. The columns can be either independent or share a multi-axis magnetic or electromagnetic-compound objective lens. See U.S. Pat. No. 8,294,095, whose disclosure is hereby incorporated by reference in its entirety. The probe spots generated by a multi-column apparatus may be spaced apart by a distance as large as 30-50 mm.

If the beams are from a single source, a source-conversion unit may be used to form multiple virtual or real images of the single source. Each of the images and the single source may be viewed as an emitter of a beam (also called a "beamlet" as all of the beamlets are from the same source). The source-conversion unit may have an electrically conductive layer with multiple openings that can divide the charged particles from the single source into multiple beamlets. The source-conversion unit may have optics elements that can influence the beamlets to form multiple virtual or real images of the single source. Each of the images can be viewed as a source that emits one of the beamlets. The beamlets may be spaced apart by a distance of micrometers. A single column, which may have a projection system and a deflection scanning unit, may be used to scan and focus the beamlets on multiple regions of a sample. The signals generated by the beamlets may be respectively detected by multiple detection elements of a detector inside the single column. An apparatus using beams from a single source may be called as a multi-beam apparatus.

There are at least two methods to form the images of the single source. In the first method, each optics element has an electrostatic micro-lens that focuses one beamlet and thereby forms one real image. See, e.g., U.S. Pat. No. 7,244,949, whose disclosure is hereby incorporated by reference in its entirety. In the second method, each optics element has an electrostatic micro-deflector which deflects one beamlet thereby forms one virtual image. See, e.g., U.S. Pat. No. 6,943,349 and U.S. patent application Ser. No. 15/065,342, whose disclosures are hereby incorporated by reference in their entirety. Interactions (e.g., the Coulomb effect) among the charged particles in the second method may be weaker than that in the first method because a real image has a higher current density.

Figure 2A:
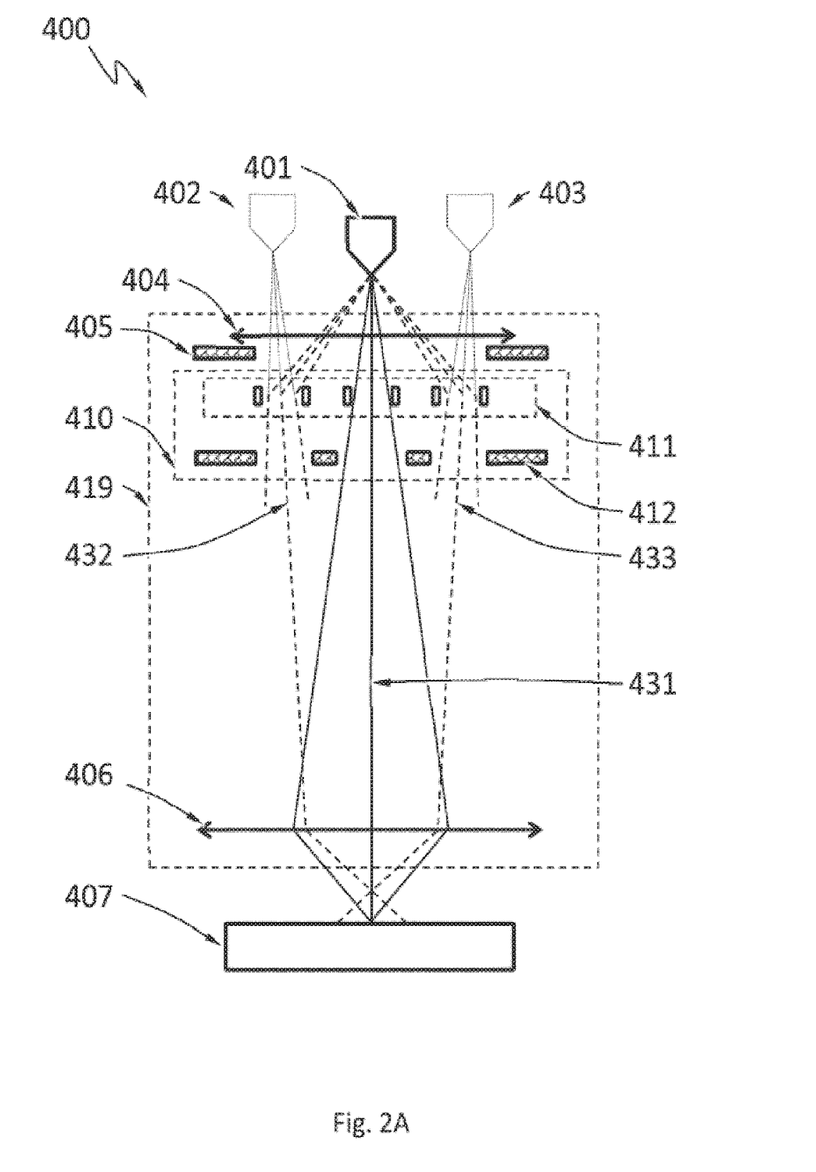
FIG. 2A schematically shows an apparatus that can carry out charged particle beam inspection using multiple beams of charge particles, where the charged particles in the multiple beams are from a single source (a "multi-beam" apparatus).

FIG. 2A schematically shows an apparatus 400 that can carry out charged particle beam inspection using multiple beams of charge particles, where the charged particles in the multiple beams are from a single source. Namely, the apparatus 400 is a multi-beam apparatus. The apparatus 400 has a source 401 that can produce charged particles in free space. In an example, the charged particles are electrons and the source 401 is an electron gun. The apparatus 400 has an optics system 419 that can generate with the charged particles multiple probe spots on a surface of a sample 407 and scan the probe spots on the surface of the sample 407. The optics system 419 may have a condenser lens 404 and a main aperture 405 upstream or downstream with respect to the condenser lens 404. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The optics system 419 has a source-conversion unit 410 configured to form multiple virtual images (e.g., virtual images 402 and 403) of the source 401. The virtual images and the source 401 each can be viewed as an emitter of a beamlet (e.g., beamlets 431, 432 and 433). The source-conversion unit 410 may have an electrically conductive layer 412 with multiple openings that can divide the charged particles from the source 401 into multiple beamlets, and optics elements 411 that can influence the beamlets to form the virtual images of the source 401. The optics elements 411 may be micro-deflectors configured to deflect the beamlets. The electric current of the beamlets may be affected by the sizes of the openings in the electrically conductive layer 412 or the focusing power of the condenser lens 404. The optics system 419 includes an objective lens 406 configured to focus the multiple beamlets and thereby form multiple probe spots onto the surface of the sample 407. The source-conversion unit 410 may also have micro-compensators configured to reduce or eliminate aberrations (e.g., field curvature and astigmatism) of the probe spots.

Figure 2B:
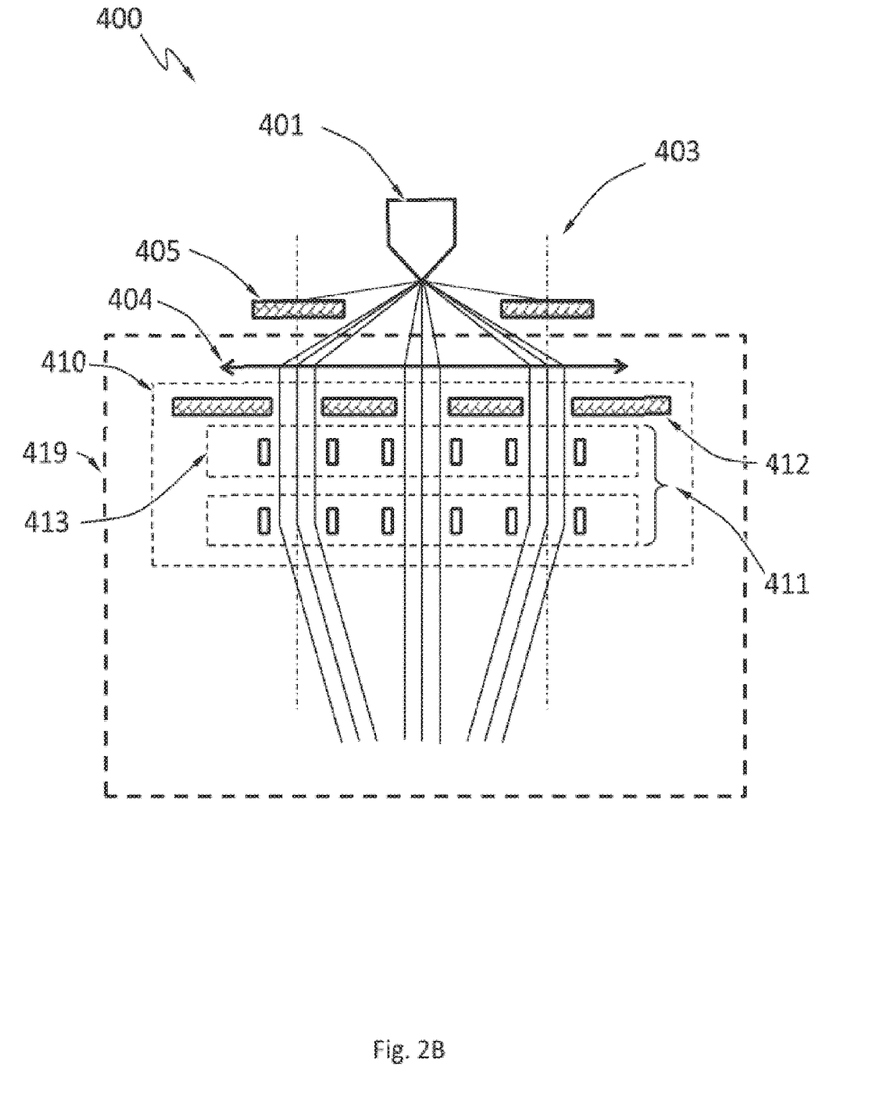
FIG. 2B schematically shows an alternative multi-beam apparatus.

FIG. 2B schematically shows an alternative multi-beam apparatus. The condenser lens 404 collimates the charged particles from the source 401. The optics elements 411 of the source-conversion unit 410 may comprise micro-compensators 413. The micro-compensators 413 may be separate from micro-deflectors or may be integrated with micro-deflectors. If separated, the micro-compensators 413 may be positioned upstream to the micro-deflectors. The micro-compensators 413 are configured to compensate for off-axis aberrations (e.g., field curvature, astigmatism and distortion) of the condenser lens 404 or an objective lens (such as the objective lens 406 of FIG. 2A). The off-axis aberrations may negatively impact the sizes or positions of the probe spots formed by off-axis (i.e., being not along the primary optical axis of the apparatus) beamlets. The off-axis aberrations of the objective lens 406 may not be completely eliminated by deflection of the beamlets. The micro-compensators 413 may compensate for the residue off-axis aberrations (i.e., the portion of the off-axis aberrations that cannot be eliminated by deflection of the beamlets) of the objective lens 406, or non-uniformity of the sizes of the probe spots. Each of the micro-compensators 413 is aligned with one of the openings in the electrically conductive layer 412. The micro-compensators 413 may each have four or more poles. The electric currents of the beamlets may be affected by the sizes of the openings in the electrically conductive layer 412 and/or the position of the condenser lens 404.

Figure 2C:
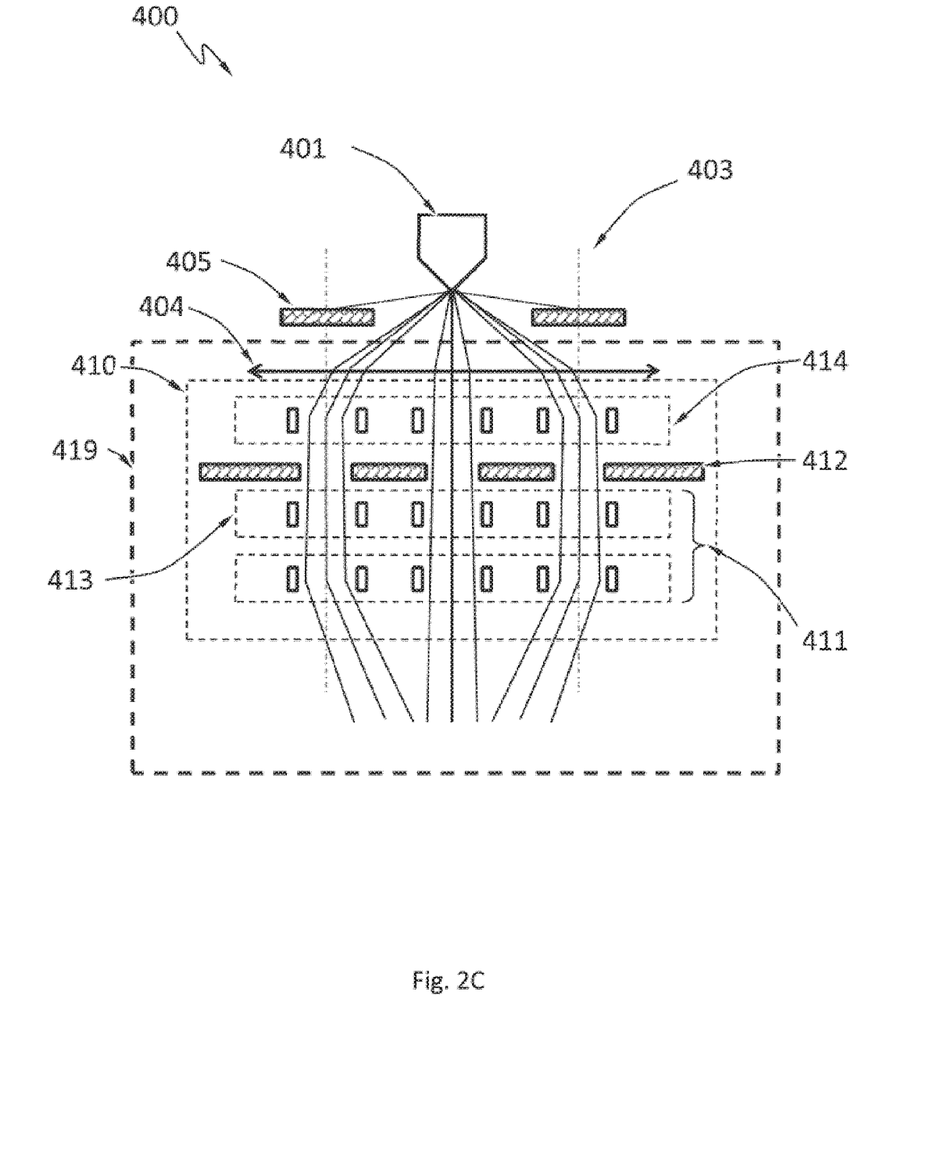
FIG. 2C schematically shows an alternative multi-beam apparatus.

FIG. 2C schematically shows an alternative multi-beam apparatus. The optics elements 411 of the source-conversion unit 410 may comprise pre-bending micro-deflectors 414. The pre-bending micro-deflectors 414 are micro-deflectors configured to bend the beamlets before they go through the openings in the electrically conductive layer 412.

Additional descriptions of apparatuses using multiple beams of charge particles from a single source may be found in U.S. Patent Application Publications 2016/0268096, 2016/0284505 and 2017/0025243, U.S. Pat. No. 9,607,805, U.S. patent application Ser. Nos. 15/365,145, 15/213,781, 15/216,258 and 62/440,493, and PCT Application PCT/US17/15223, the disclosures of which are hereby incorporated by reference in their entirety.

Figure 3:
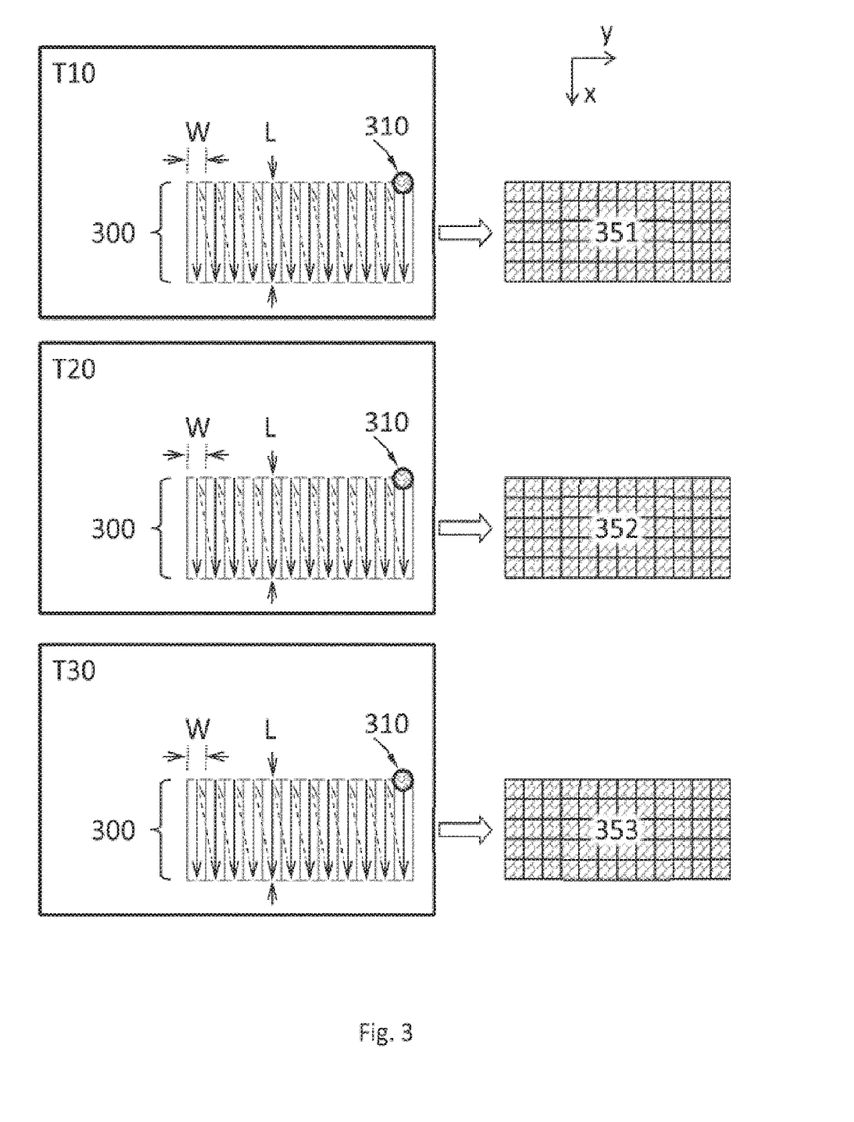
FIG. 3 schematically shows inspecting a sample using one beam of charged particles.

When a region of a sample (e.g., a substrate or a patterning device) is inspected with one beam of charged particles, a signal representing the interactions of the beam and the sample is recorded from the probe spot formed by the beam in the region. The signal may include random noises. To reduce the random noises, the probe spot may scan the region multiple times, and the signals recorded from the same locations at different times may be averaged. FIG. 3 schematically shows inspecting a sample using one beam of charged particles. FIG. 3 shows the movement of the probe spot 310 relative to the sample. The sample may move during scanning of the probe spot 310. The diameter of the probe spot 310 is W. The region 300 to be inspected shown in this example is rectangular in shape but not necessarily so. For convenience, two directions x and y are defined in a reference frame ("RF") that has no movement relative to the sample. The x and y directions are mutually perpendicular. During time period T10, the probe spot 310 scans across the entirety of the region 300, which means that every location in the region 300 is within the probe spot 310 at some point of time during time period T10. For example, the probe spot 310 may move in the x direction by a length L (represented by solid arrows), during which signals representing the interaction of the beam and the sample are recorded from the probe spot 310; may move in the −x direction by length L and in the −y direction by width W (represented by dotted arrows), during which no signals representing the interaction of the beam and the sample are recorded from the probe spot 310. These back-and-forth movements of the probe spot 310 may be repeated until the probe spot 310 scans across the entirety of the region 300. Other movements of the probe spot 310 to cover the entirety of the region may be possible. An image 351 of the region 300 may be generated from the signals recorded during time period T10. For example, the image 351 may be generated by digitizing the signals in magnitude or in space. The image 351 may be a compilation of digital values representing the magnitudes of the signals recorded when the probe spot 310 was at a plurality of locations within the region 300, respectively. Although the word "image" is used, the image 351 is not necessarily in a form readily perceivable by human eyes. For example, the image 351 may be values stored in a computer memory. Additional images such as images 352 and 353 may be obtained during time periods such as T20 and T30 that are different from time period T10, in the same or different fashion. The time periods T10, T20 and T30 may not be temporally continuous. The images obtained from the probe spot 310 generated by the same beam of charged particles are averaged (e.g., simple average, weighted average, running average, etc.). For example, when the images 351, 352 and 353 are compilations of digital values representing the magnitudes of the signals recorded when the probe spot 310 was at a plurality of locations within the region 300, averaging the images 351, 352 and 353 may be done by averaging the digital values at the same location. Namely, the average of the images 351, 352 and 353 may be a compilation of the averages of the digital values of the images 351, 352 and 353 respectively at the plurality of locations.

Figure 4:
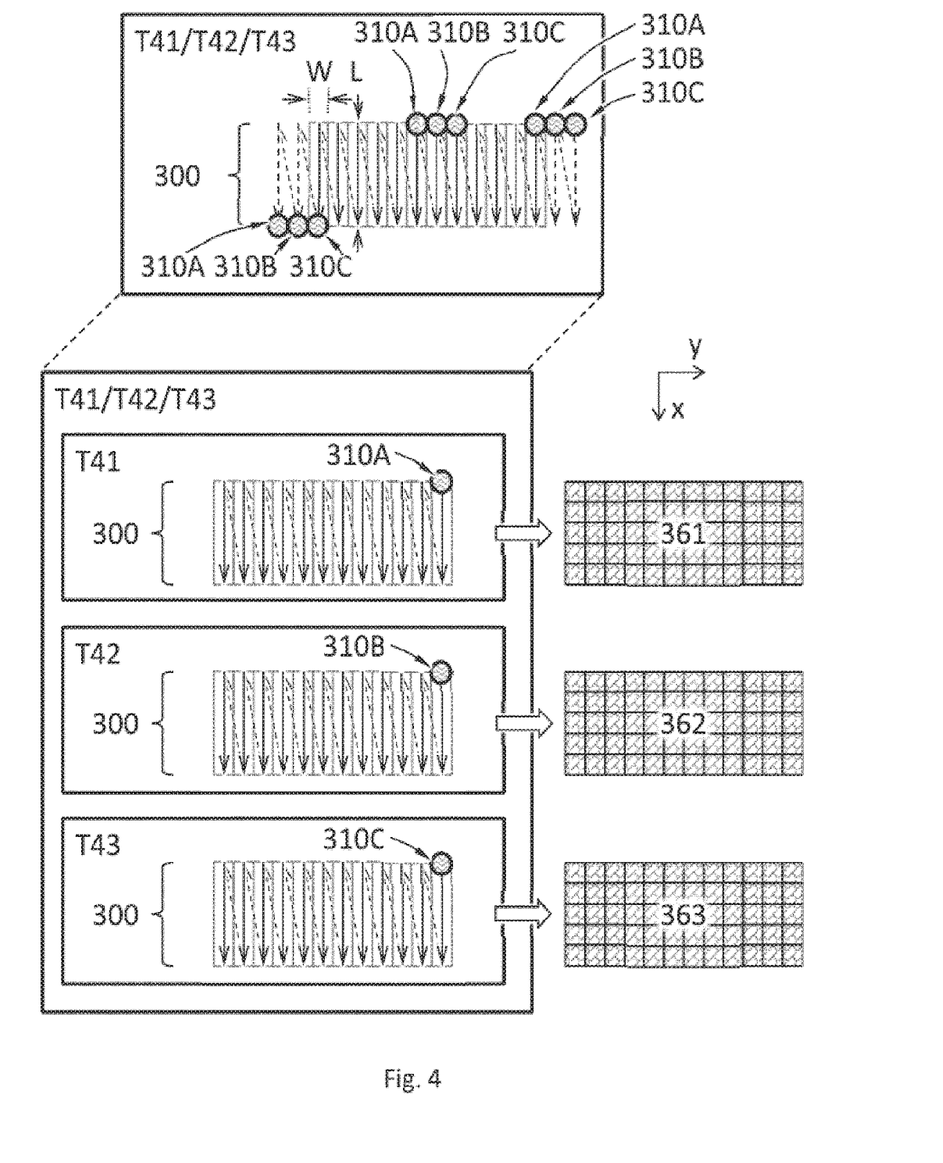
FIG. 4 schematically shows inspecting a sample using multiple beams of charged particles, according to an embodiment.

FIG. 4 schematically shows inspecting a sample using multiple beams of charged particles, according to an embodiment. In this example, three beams generate three probe spots 310A-310C on a sample. FIG. 4 shows the movement of the three probe spots 310A-310C relative to the sample. The three probe spots 310A-310C may be but not necessarily arranged in a row. The width of the three probe spots 310A-310C is W in this example. The width of the probe spots is not necessarily the same. The three probe spots 310A-310C may or may not have movement relative to one another.

The region 300 to be inspected in this example is rectangular in shape but not necessarily so. In this example, during time periods T41, T42 and T43, the three probe spots 310A-310C are respectively scanned across the entirety of the region 300, which means that every location in the region 300 is within the probe spots 310A-310C at some point of time during time periods T41-T43, respectively. For example, the three probe spots 310A-310C may move in the x direction by a length L (represented by solid arrows), during which signals representing the interaction of the beam and the sample are recorded from the probe spots 310A-310C; move in the −x direction by length L and in the −y direction by width W (represented by dotted arrows), during which no signals representing the interaction of the beam and the sample are recorded from the three probe spots 310A-310C. These back-and-forth movements may be repeated until each of the three probe spots 310A-310C is scanned across the entirety of the region 300. The three probe spots 310A-310C may be at different locations at the beginning of time period T41, T42 or T43 and the locations may be outside the region 300. For example, as shown in FIG. 4, at the beginning of time period T41, probe spot 310A is at the extreme of the region 300 in the y direction; probe spot 310B is adjacent to probe spot 310A and outside the region 300; probe spot 310C is adjacent to probe spot 310B and further outside the region 300. The three probe spots 310A-310C may be at different locations in the duration of time period T41, T42 or T43. For example, as shown in FIG. 4, at a time in the duration of time period T41, T42 or T43, the probe spots 310A-310C are adjacent to one another and inside the region 300. Similarly, the three probe spots 310A-310C may be at different locations at the end of time period T43 and the locations may be outside the region 300. For example, as shown in FIG. 4, at the end of time period T43, probe spot 310C is at the extreme of the region 300 in the −y direction; probe spot 310B is adjacent to probe spot 310C and outside the region 300; probe spot 310A is adjacent to probe spot 310B and further outside the region 300. An image 361 of the region 300 may be formed from the signals recorded from probe spot 310A during time period T41. An image 362 of the region 300 may be formed from the signals recorded from probe spot 310B during time period T42. An image 363 of the region 300 may be formed from the signals recorded from probe spot 310C during time period T43. For example, the images 361-363 may be formed by digitizing the signals in magnitude or in space. The images 361-363 may be a compilation of digital values representing the magnitudes of the signals recorded when the probe spots 310A-310C were at a plurality of locations within the region 300, respectively. Although the word "image" is used, the images 361-363 are not necessarily in a form readily perceivable by human eyes. For example, the images 361-363 may be values stored in a computer memory. The time periods T41, T42 and T43 may have some overlap (as in this example), complete overlap (as in the example shown in FIG. 5), or no overlap at all. The time periods T41, T42 and T43 may not be temporally continuous. In this example, the time periods T41, T42 and T43 have the same length but begin at different time and end at different time. The images 361-363 are averaged (e.g., simple average, weighted average, running average, etc.). For example, when the images 361-363 are compilations of digital values representing the magnitudes of the signals recorded when the probe spots 310A-310C were at a plurality of locations within the region 300, averaging the images 361-363 may be done by averaging the digital values at the same location. Namely, the average of the images 361-363 may be a compilation of the averages of the digital values of the images 361-363 respectively at the plurality of locations. In this example, no two of the three probe spots 310A-310C are at the same location in the region 300 at the same time when signals representing the interaction of the beams that generated these two probe spots and the sample are recorded.

Figure 5:
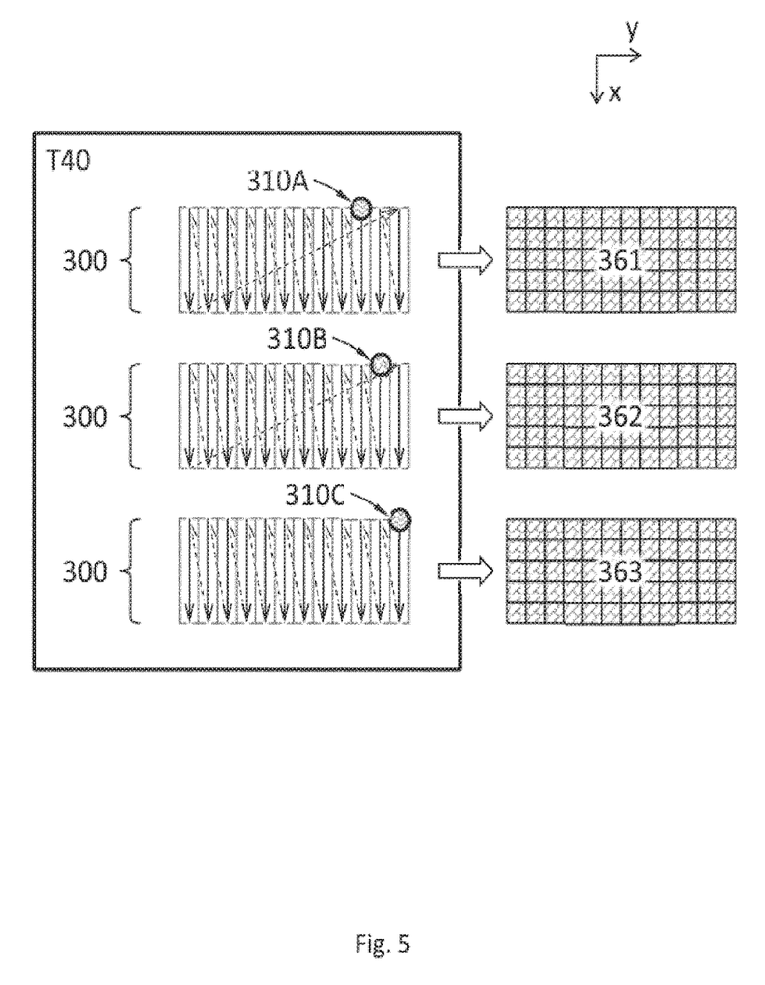
FIG. 5 schematically shows inspecting a sample using multiple beams of charged particles, according to an embodiment.

FIG. 5 schematically shows inspecting a sample using multiple beams of charged particles, according to an embodiment. In this example shown, three beams generate three probe spots 310A-310C on a sample. FIG. 5 shows the movement of the three probe spots 310A-310C relative to the sample. The three probe spots 310A-310C may be but not necessarily arranged in a row. The width of the three probe spots 310A-310C is W in this example. The width of the probe spots is not necessarily the same. The three probe spots 310A-310C may or may not have movement relative to one another. The region 300 to be inspected shown in this example is rectangular in shape but not necessarily so. In this example, during time period T40, each of the three probe spots 310A-310C is scanned across the entirety of the region 300, which means that every location in the region 300 is within each of the probe spots 310A-310C at some point of time during time period T40. For example, the three probe spots 310A-310C may move in the x direction by a length L (represented by solid arrows), during which signals representing the interaction of the beam and the sample are recorded from the probe spots 310A-310C; move in the −x direction by length L and in the −y direction or the y direction by one or multiples of width W (represented by dotted arrows), during which no signals representing the interaction of the beam and the sample are recorded from the three probe spots 310A-310C. These back-and-forth movements may be repeated until each of the three probe spots 310A-310C scans across the entirety of the region 300. The three probe spots 310A-310C may be at different locations at the beginning of time period T40. For example, as shown in FIG. 5, at the beginning of time period T40, probe spot 310C is at the extreme of the region 300 in the y direction; probe spot 310B is adjacent to probe spot 310C and inside the region 300; probe spot 310A is adjacent to probe spot 310B and further inside the region 300. Similarly, the three probe spots 310A-310C may be at different locations during or at the end of time period T40. An image 361 of the region 300 may be formed from the signals recorded from probe spot 310A during time period T40. An image 362 of the region 300 may be formed from the signals recorded from probe spot 310B during time period T40. An image 363 of the region 300 may be formed from the signals recorded from probe spot 310C during time period T40. For example, the images 361-363 may be formed by digitizing the signals both in magnitude and in space. The images 361-363 may be a compilation of digital values representing the magnitudes of the signals recorded when the probe spots 310A-310C were at a plurality of locations within the region 300, respectively. Although the word "image" is used, the images 361-363 are not necessarily in a form readily perceivable by human eyes. For example, the images 361-363 may be values stored in a computer memory. The time period T40 may not be temporally continuous. The images 361-363 are averaged (e.g., simple average, weighted average, running average, etc.). For example, when the images 361-363 are compilations of digital values representing the magnitudes of the signals recorded when the probe spots 310A-310C were at a plurality of locations within the region 300, averaging the images 361-363 may be done by averaging the digital values at the same location. Namely, the average of the images 361-363 may be a compilation of the averages of the digital values of the images 361-363 respectively at the plurality of locations. In this example, no two of the three probe spots 310A-310C are at the same location in the region 300 at the same time when signals representing the interaction of the beams that generated these two probe spots and the sample are recorded.

Figure 6:
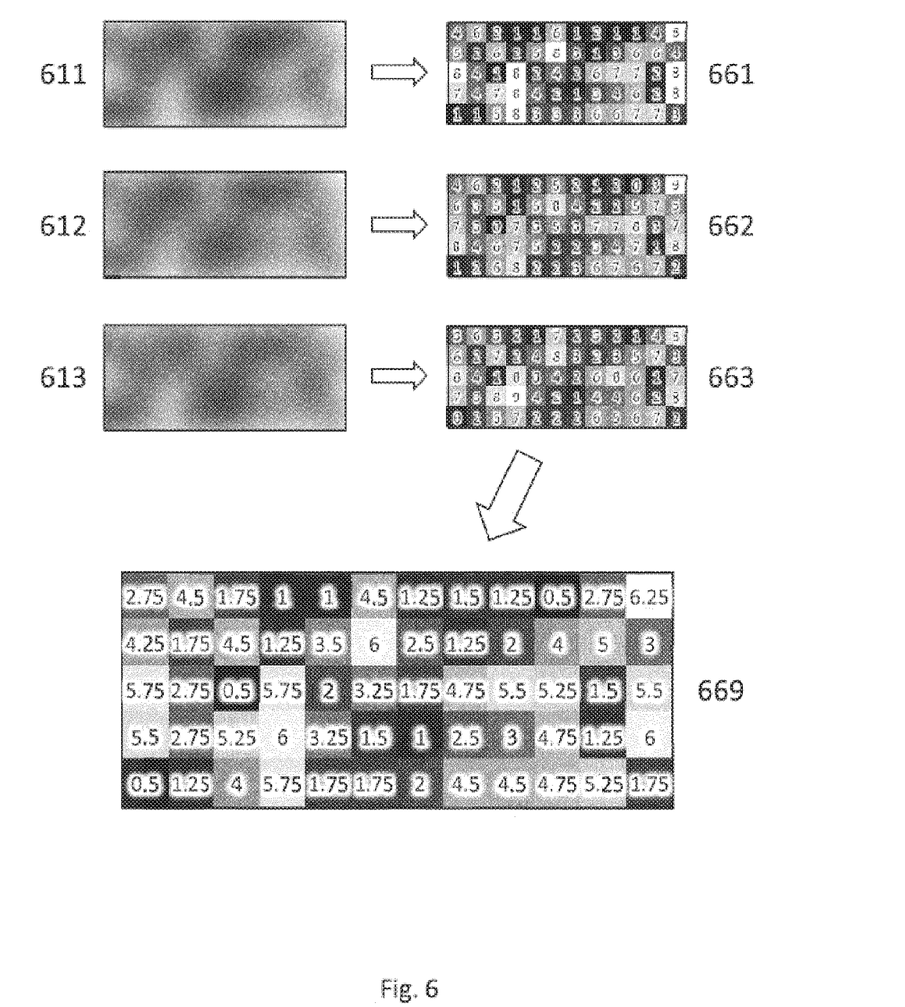
FIG. 6 schematically shows image averaging, according to an embodiment.

FIG. 6 schematically shows image averaging, according to an embodiment. Multiple sets (e.g., sets 611-613) of signals are recorded from multiple probe spots (e.g., probe spots 310A-310C) during multiple time periods (e.g., time periods T41-T43). The sets of signals may be analog signals in the example shown here. Images (e.g., images 661-663) may be formed by respectively digitizing the sets of signals both in magnitude and in space. The values and shades shown in this example represent the magnitudes of digitized signals. An averaged image (e.g., averaged image 669) is formed by averaging the magnitudes of digitized signals at the corresponding locations in the images Other methods of averaging are possible.

Figure 7:
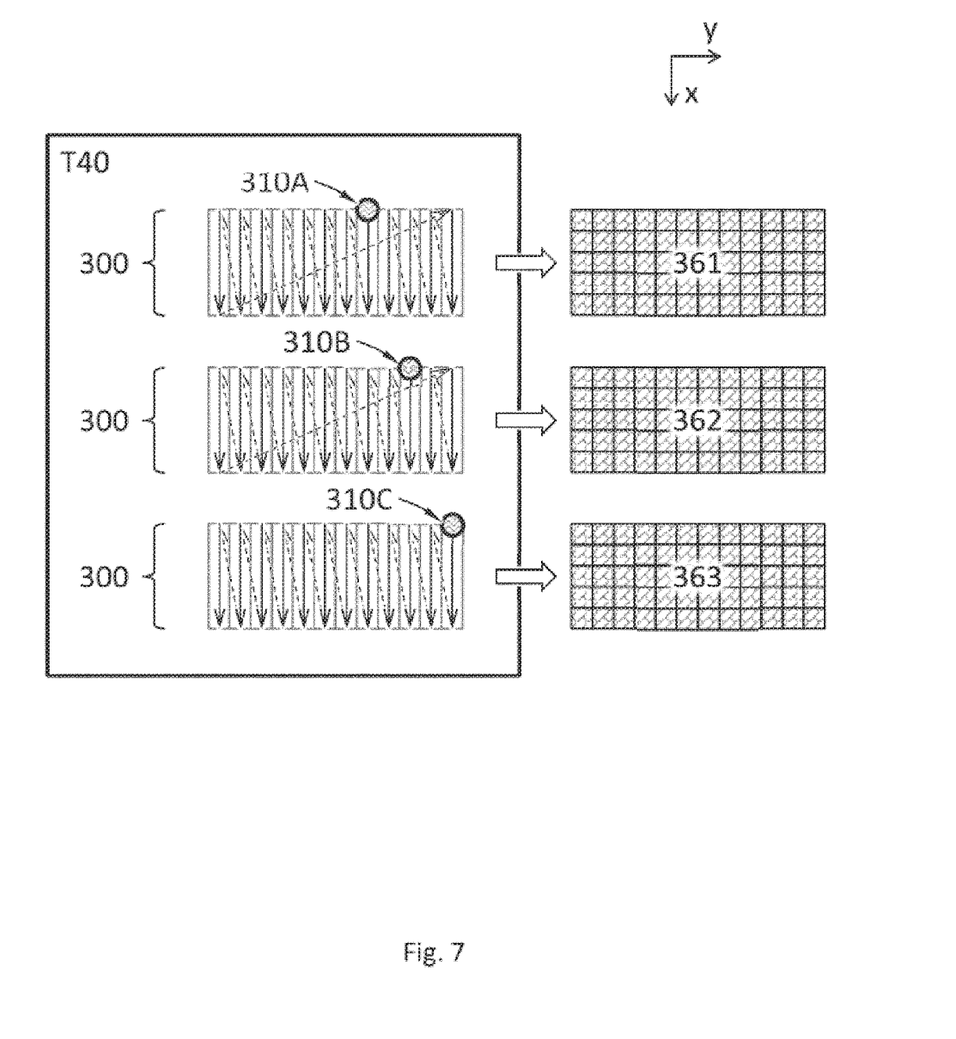
FIG. 7 schematically shows inspecting a sample using multiple beams of charged particles, according to an embodiment.

FIG. 7 schematically shows inspecting a sample using multiple beams of charged particles, according to an embodiment. In this example shown here, which is similar to the example in shown in FIG. 5, three beams generate three probe spots 310A-310C on a sample. FIG. 7 shows the movement of the three probe spots 310A-310C relative to the sample. In the example shown in FIG. 5, the probe spots 310A-310C are adjacent to one another. In the example shown in FIG. 7, the three probe spots 310A-310C may be spaced apart, for example, by multiples of width W. Having the probe spots 310A-310C spaced apart may reduce interactions of the beams that generate the probe spots 310A-310C, or interference of the signals recorded from the probe spots 310A-310C.

Figure 8:
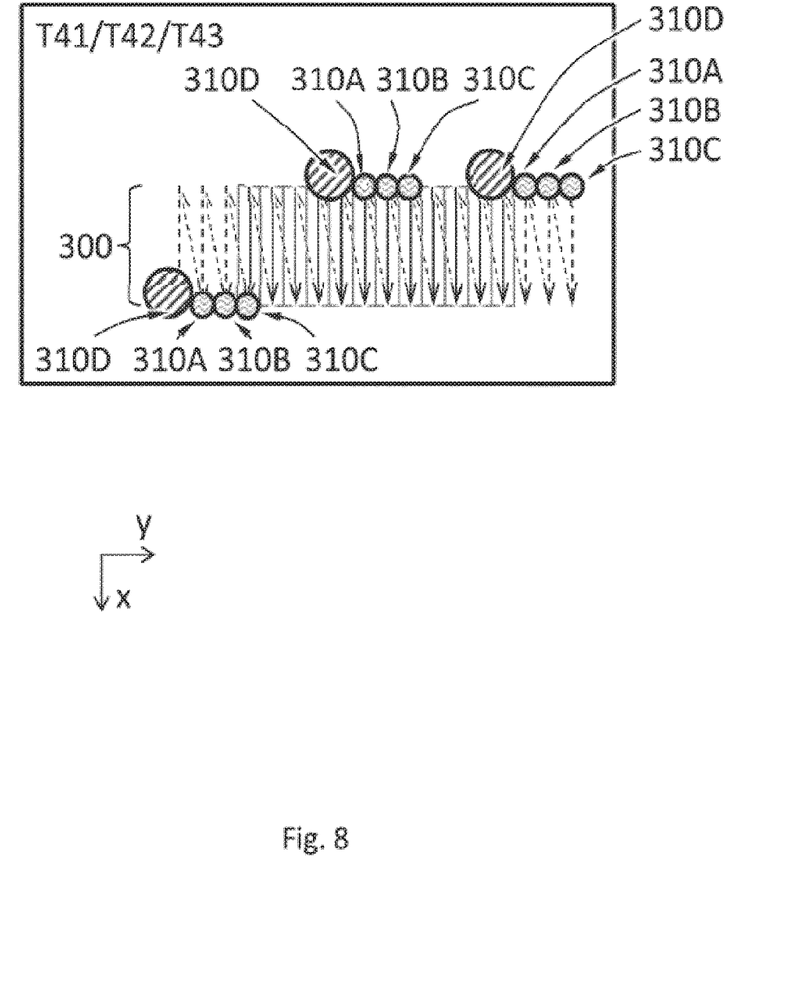
FIG. 8 schematically shows inspecting a sample using multiple beams of charged particles, according to an embodiment.

FIG. 8 schematically shows inspecting a sample using multiple beams of charged particles, according to an embodiment, where one or more additional beams of charged particles may be used for other purposes than generating signals for imaging. The example shown in FIG. 8 is similar to the example shown in FIG. 4 but has a spot 310D generated on the sample by an additional beam of charged particles for charging the region 300 with electric charges before the probe spots 310A-310C scan across the region 300. The spot 310D may have a different size or a different intensity than the probe spots 310A-310C. The spot 310D may scan the region 300 before or while the probe spots 310A-310C scan the region 300. In an embodiment, no signal is recorded from the spot 310D.

Figure 9:
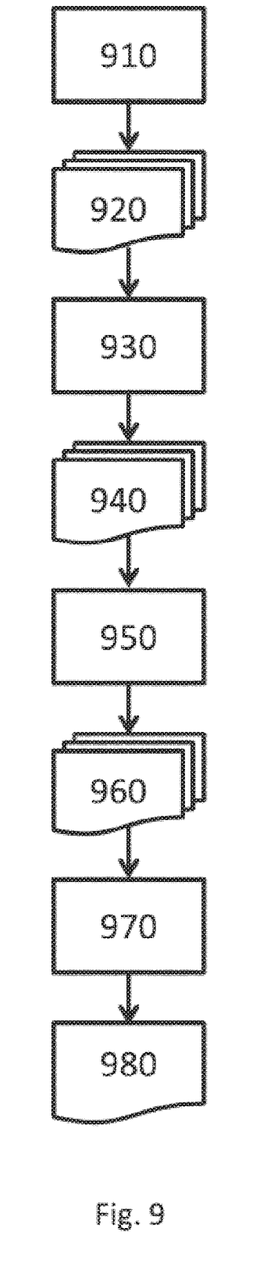
FIG. 9 shows a flowchart for a method of inspecting a sample using multiple beams of charged particles, according to an embodiment.

FIG. 9 shows a flowchart for a method of inspecting a sample using multiple beams of charged particles, according to an embodiment. In procedure 910, a plurality of probe spots 920 are generated on the sample by a plurality of beams of charged particles. The plurality of probe spots 920 may have the same size or different sizes. The plurality of probe spots 920 may have the same intensity or different intensities. The plurality of probe spots 920 may be adjacent to one another or spaced apart. Additional spots may be generated on the sample by additional beams of charged particles, and may have different sizes or intensities from that of the probe spots 920. In procedure 930, while the probe spots 920 are scanned across a region on the sample, a plurality of sets of signals 940 respectively representing the interactions of the plurality of beams of charged particles and the sample are recorded from the probe spots 920. The probe spots 920 may have movements relative to one another while the probe spots 920 are scanned across the region. The probe spots 920 may be scanned across the region during different time periods. The probe spots 920 may be scanned across different parts of the region without scanning the region in between. The sets of signals 940 may be recorded not all the time while the probe spots 920 are scanned across the region. In procedure 950, a plurality of images 960 of the region are generated respectively from the sets of signals 940. Each of the images 960 may be generated from only one of the sets of signals 940. The images 960 may be generated by digitizing the sets of signals 940 with respect to the magnitudes of the signals and the locations of the probe spot 920. The images 960 may have pixels of finite sizes. The images 960 may not be in a form readily perceivable by human eyes. For example, the images 960 may be compilations of digital values representing magnitudes of the signals, stored in computer readable storage media. In procedure 970, a composite image 980 of the region is generated from the plurality of images 960. The composite image 980, like the images 960, may not be in a form readily perceivable by human eyes. In an example, the composite image 980 may be a compilation of averages of the digital values of the images 960.

The embodiments may further be described using the following clauses:

1. A method comprising:

generating a plurality of probe spots on a sample by a plurality of beams of charged particles;

while scanning the plurality of probe spots across a region on the sample, recording from the plurality of probe spots a plurality of sets of signals respectively representing interactions of the plurality of beams of charged particles and the sample;

generating a plurality of images of the region respectively from the plurality of sets of signals; and generating a composite image of the region from the plurality of images.

2. The method of clause 1, wherein the plurality of probe spots have different sizes or different intensities.

3. The method of clause 1, wherein the plurality of probe spots are spaced apart.

4. The method of clause 1, wherein the plurality of probe spots have movements relative to one another while being scanned.

5. The method of clause 1, wherein time periods during which the plurality of probe spots are respectively scanned across the region are different.

6. The method of clause 5, wherein the time periods are not temporally continuous.

7. The method of clause 5, wherein the time periods have partial overlaps.

8. The method of clause 5, wherein the plurality of sets of signals are recorded not during an entirety of the time periods.

9. The method of clause 1, wherein each of the plurality of images of the region is generated from only one of the plurality of sets of signals.

10. The method of clause 1, wherein generating the plurality of images of the region comprises digitizing the plurality of sets of signals with respect to magnitudes of the signals or locations of the plurality of probe spots.

11. The method of clause 1, wherein the plurality of images of the region are compilations of digital values representing magnitudes of the signals.

12. The method of clause 11, wherein the composite image of the region is a compilation of averages of the digital values.

13. The method of clause 1, wherein generating the composite image of the region comprises averaging the plurality of images of the region.

14. The method of clause 13, wherein averaging the plurality of images is by simple average, weighted average or running average.

15. The method of clause 1, further comprising generating an additional spot on the sample from another beam of charged particles.

16. The method of clause 15, wherein the additional spot has a different size or a different intensity from that of the plurality of the probe spots.

17. The method of clause 15, further comprising charging the region with electric charges, using the additional spot.

18. The method of clause 15, further comprising scanning the additional spot before or while scanning the plurality of probe spots.

19. The method of clause 15, wherein no signal representing interactions of the other beam and the sample is recorded from the additional spot.

20. A computer program product comprising a non-transitory computer readable medium having instructions recorded thereon, the instructions when executed by a computer implementing the method of any of clauses 1-19.

Although the disclosure above is made with respect to multi-beam apparatuses (i.e., apparatuses that can carry out charged particle beam inspection using multiple beams of charge particles, where the charged particles in the multiple beams are from a single source), the embodiments may be applicable in multi-column apparatuses (i.e., apparatuses that can carry out charged particle beam inspection using multiple beams of charge particles, where the multiple beams of charge particles are produced from multiple sources). Additional descriptions of multi-column apparatuses may be found in U.S. Pat. No. 8,294,095, the disclosure of which is hereby incorporated by reference in its entirety.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
generating a plurality of probe spots on a sample by a plurality of beams of charged particles;
while scanning the plurality of probe spots across a region on the sample, recording from the plurality of probe spots a plurality of sets of signals respectively representing interactions of the plurality of beams of charged particles and the sample;
generating a plurality of images of the region in its entirety, respectively from the plurality of sets of signals, wherein an image comprises a compilation of digital values representing magnitudes of signals at corresponding locations of a probe spot; and
generating a composite image of the region in its entirety, from the plurality of images.

2. The method of claim 1, wherein the plurality of probe spots have different sizes or different intensities.

3. The method of claim 1, wherein the plurality of probe spots are spaced apart.

4. The method of claim 1, wherein the plurality of probe spots have movements relative to one another while being scanned.

5. The method of claim 1, wherein time periods during which the plurality of probe spots are respectively scanned across the region are different.

6. The method of claim 5, wherein the time periods are not temporally continuous.

7. The method of claim 5, wherein the time periods have partial overlaps.

8. The method of claim 5, wherein the plurality of sets of signals are recorded not during an entirety of the time periods.

9. The method of claim 1, wherein each of the plurality of images of the region is generated from only one of the plurality of sets of signals.

10. The method of claim 1, wherein generating the plurality of images of the region comprises digitizing the plurality of sets of signals with respect to magnitudes of the signals or locations of the plurality of probe spots.

11. The method of claim 1, wherein the plurality of images of the region are compilations of digital values representing magnitudes of the signals.

12. The method of claim 11, wherein the composite image of the region is a compilation of averages of the digital values.

13. The method of claim 1, wherein generating the composite image of the region comprises averaging the plurality of images of the region.

14. The method of claim 13, wherein averaging the plurality of images is by simple average, weighted average or running average.

15. A computer program product comprising a non-transitory computer readable medium having instructions recorded thereon, the instructions when executed by a computer implementing the method of claim 1.

* * * * *